(12) United States Patent
Morijiri et al.

(10) Patent No.: US 11,887,748 B2
(45) Date of Patent: Jan. 30, 2024

(54) ADHESIVE COMPOSITION AND COUPLING STRUCTURE

(71) Applicant: Resonac Corporation, Tokyo (JP)

(72) Inventors: Tomoki Morijiri, Tokyo (JP); Kengo Shinohara, Tokyo (JP); Ayao Matsukawa, Tokyo (JP)

( * ) Notice: Subject to any disclaimer, the term of this patent is extended or adjusted under 35 U.S.C. 154(b) by 0 days.

(21) Appl. No.: 17/907,541

(22) PCT Filed: Feb. 17, 2021

(86) PCT No.: PCT/JP2021/005961
§ 371 (c)(1),
(2) Date: Sep. 28, 2022

(87) PCT Pub. No.: WO2021/199756
PCT Pub. Date: Oct. 7, 2021

(65) Prior Publication Data
US 2023/0146296 A1    May 11, 2023

(30) Foreign Application Priority Data
Mar. 30, 2020    (JP) .................................. 2020-059927

(51) Int. Cl.
*H01B 1/22*      (2006.01)
*C09J 9/02*      (2006.01)
(Continued)

(52) U.S. Cl.
CPC .................. *H01B 1/22* (2013.01); *C09J 9/02* (2013.01); *C09J 11/04* (2013.01); *H01R 11/01* (2013.01)

(58) Field of Classification Search
CPC ...... H01B 1/22; H01B 1/00; C09J 9/02; C09J 11/04; C09J 2203/318; C09J 2203/326;
(Continued)

(56) References Cited

U.S. PATENT DOCUMENTS

2019/0206587 A1* 7/2019 Sou ............................ C09J 9/02

FOREIGN PATENT DOCUMENTS

JP    2007-094412    4/2007
JP    2013-149774    8/2013
(Continued)

OTHER PUBLICATIONS

International Preliminary Report on Patentability with Written Opinion dated Oct. 13, 2022 for PCT/JP2021/005961.
(Continued)

*Primary Examiner* — Mark Kopec
*Assistant Examiner* — Jaison P Thomas
(74) *Attorney, Agent, or Firm* — SOEI PATENT & LAW FIRM (57) ABSTRACT

A connected structure including: a first circuit member having a first electrode; a second circuit member having a second electrode; and a connecting portion provided between the first circuit member and the second circuit member and electrically connecting the first electrode and the second electrode to each other, wherein at least one of the first electrode and the second electrode has a layer made of Cu or Ag as an outermost surface thereof, and the connecting portion contains a conductive particle having a layer made of Pd or Au as an outermost surface thereof.

7 Claims, 3 Drawing Sheets

(51) Int. Cl.
  *C09J 11/04* (2006.01)
  *H01R 11/01* (2006.01)
(58) Field of Classification Search
  CPC . C09J 2301/408; C09J 2433/00; H01R 11/01;
  H01R 4/04; H01R 4/625; H01R 12/79;
  H01L 21/50; C08K 3/08; C08K
  2003/0831; C08K 2201/001; C08K
  2201/013
  See application file for complete search history.

(56) References Cited

FOREIGN PATENT DOCUMENTS

| | | |
|---|---|---|
| JP | 2013-214417 | 10/2013 |
| JP | 2016-181511 | 10/2016 |

OTHER PUBLICATIONS

International Search Report dated Apr. 20, 2021 for PCT/JP2021/005961.

* cited by examiner

ADHESIVE COMPOSITION AND COUPLING STRUCTURE

CROSS-REFERENCE TO RELATED APPLICATIONS

This application is a 35 U.S.C. § 371 national phase application of PCT/JP2021/005961, filed on Feb. 17, 2021, which claims priority to Japanese Patent Application No. 2020-059927, filed on Mar. 30, 2020.

TECHNICAL FIELD

The present invention relates to an adhesive composition and a connected structure.

BACKGROUND ART

In recent years, electronic components have become smaller and thinner, and have higher performance, and along with this, high-density mounting techniques have been actively developed. In such high-density mounting, it is difficult to deal with circuit members having fine circuit electrodes using solder and rubber connectors in the related art. Therefore, a connection method using an anisotropic conductive adhesive having excellent resolution and a film thereof is often used. In this connection method, for example, when connecting flexible print circuit boards (FPC) to a glass substrate of a liquid crystal display, an anisotropic conductive adhesive film containing conductive particles is sandwiched between electrodes facing each other and heat and pressure are applied thereto to bond and fix the circuit members and electrically connect the electrodes of both the circuit members while maintaining insulation properties of adjacent electrodes on the same circuit member.

As the conductive particles used in the anisotropic conductive adhesive as described above, for example, Patent Literature 1 discloses conductive particles in which a metal layer is formed on the surface of particles for film formation and has a Vickers hardness (Hv) of 35 to 400 and a thickness of 5 nm to 250 nm. This metal layer formed on the surface of the conductive particles is made of at least one metallic material selected from the group consisting of copper (Cu), aluminum (Al), nickel (Ni), Titanium (Ti), and ruthenium (Ru).

CITATION LIST

Patent Literature

[Patent Literature 1] Japanese Unexamined Patent Publication No. 2016-181511

SUMMARY OF INVENTION

Technical Problem

However, according to the studies of the present inventors, it has become clear that, in a case where the outermost surfaces of electrodes to be connected are composed of a layer made of Cu or Ag, favorable connection can be obtained at the beginning of the connection, but the connection cannot be maintained over a long period of time (connection reliability is insufficient) even if the adhesive containing conductive particles as disclosed in Patent Literature 1 is used.

Therefore, an object of the present invention is to obtain more reliable electrical connection in a case where circuit members in which electrodes have a layer made of Cu or Ag on outermost surfaces thereof are connected to each other using an adhesive containing conductive particles.

Solution to Problem

One aspect of the present invention is a connected structure including: a first circuit member having a first electrode; a second circuit member having a second electrode; and a connecting portion provided between the first circuit member and the second circuit member and electrically connecting the first electrode and the second electrode to each other, wherein at least one of the first electrode and the second electrode has a layer made of Cu or Ag as an outermost surface thereof, and the connecting portion contains a conductive particle having a layer made of Pd or Au as an outermost surface thereof.

Another aspect of the present invention is an adhesive composition including: an adhesive component; and a conductive particle, wherein the adhesive composition is used for bonding a first circuit member having a first electrode and a second circuit member having a second electrode to each other and electrically connecting the first electrode and the second electrode to each other, the conductive particle has a layer made of Pd or Au as an outermost surface thereof, and at least one of the first electrode and the second electrode has a layer made of Cu or Ag as an outermost surface thereof.

In each of the above-described aspects, the conductive particle may have a layer made of Pd as an outermost surface thereof.

Advantageous Effects of Invention

According to the present invention, it is possible to obtain more reliable electrical connection in a case where circuit members in which electrodes have a layer made of Cu or Ag on outermost surfaces thereof are connected to each other using an adhesive containing conductive particles.

DESCRIPTION OF EMBODIMENTS

Hereinafter, embodiments of the present invention will be described in detail with reference to the drawings according to circumstances. A numerical range indicated using "to" in the present specification indicates a range including numerical values denoted before and after "to" as a minimum value and a maximum value. In addition, upper limit values and lower limit values denoted individually can be arbitrarily combined. In addition, "(meth)acrylate" in the present specification means at least one of an acrylate and a methacrylate corresponding thereto. The same applies to other similar expressions such as "(meth)acryloyl." However, the present invention is not limited to the following embodiments.

An adhesive composition according to one embodiment is an adhesive film formed in a film shape. In another embodiment, an adhesive composition may be in a state (for example, a paste form) other than a film shape.

Figure 1:
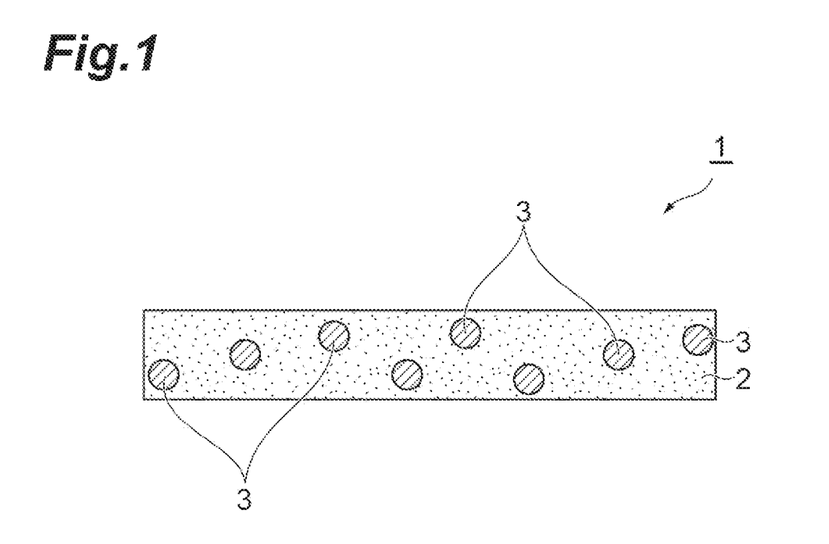
FIG. 1 is a cross-sectional view schematically illustrating one embodiment of an adhesive composition.

FIG. 1 is a cross-sectional view schematically illustrating a film-shaped adhesive composition (adhesive film) according to one embodiment. As shown in FIG. 1, an adhesive film 1 includes an adhesive component 2 and conductive particles 3 dispersed in the adhesive component 2 in one embodiment. The thickness of the adhesive film 1 may be 10 μm or more and may be 50 μm or less, for example.

In one embodiment, the adhesive component 2 has insulation properties and contains a curable component that is cured by heat or light. The adhesive component 2 is defined as a component other than the conductive particles in the adhesive composition.

The curable component may contain a polymerizable compound and a polymerization initiator, may contain a thermosetting resin, or may contain a polymerizable compound, a polymerization initiator, and a thermosetting resin.

The polymerizable compound may be, for example, a radically polymerizable compound. The radically polymerizable compound is a compound having a functional group that is polymerized by radicals. Examples of radically polymerizable compounds include (meth)acrylate compounds and maleimide compounds. The polymerizable compounds are used singly or in combination of two or more thereof. For example, the content of the polymerizable compounds may be 50 mass % or more and may be 80 mass % or less based on the total amount of an adhesive component.

Examples of (meth)acrylate compounds include urethane (meth)acrylate, methyl (meth)acrylate, ethyl (meth)acrylate, isopropyl (meth)acrylate, isobutyl (meth)acrylate, ethylene glycol di(meth)acrylate, diethylene glycol di(meth)acrylate, triethylene glycol di(meth)acrylate, dimethylol tricyclodecane di(meth)acrylate, trimethylolpropane tri(meth)acrylate, tetramethylolmethane tetra(meth)acrylate, 2-hydroxy-1,3-di(meth)acryloxypropane, 2,2-bis [4-((meth)acryloxymethoxy)phenyl]propane, 2,2-bis [4-((meth)acryloxypolyethoxy)phenyl]propane, dicyclopentenyl (meth)acrylate, tricyclodecanyl (meth)acrylate, bis((meth)acryloxyethyl) isocyanurate, ε-caprolactone-modified tris ((meth)acryloxyethyl) isocyanurate, tris((meth)acryloxyethyl) isocyanurate, and 2-(meth)acryloxyethyl acid phosphate. The radically polymerizable compounds may contain urethane (meth)acrylate from the viewpoint of adhesiveness.

The viscosity of the polymerizable compounds at 25° C. may be 100,000 mPa·s or more, and may be 1,000,000 mPa·s or less or 500,000 mPa·s or less. The viscosity of the polymerizable compounds can be measured using a commercially available E-type viscometer.

The polymerization initiator may be, for example, a radical polymerization initiator. The radical polymerization initiator is a compound that decomposes by heating or light to generate free radicals, and examples thereof include peroxide compounds and azo compounds. The polymerization initiator is appropriately selected depending on the target connection temperature, connection time, pot life, and the like. For example, the content of the polymerization initiator may be 0.05 mass % or more and may be 15 mass % or less based on the total amount of an adhesive component.

The radical polymerization initiator may be, for example, one or more selected from benzoyl peroxide, diacyl peroxide, a peroxydicarbonate, a peroxy ester, a peroxy ketal, a dialkyl peroxide, and a hydroperoxide. The radical polymerization initiator may be an organic peroxide having a half-life of 10 hours at a temperature of 40° C. or higher and a half-life of 1 minute at a temperature of 180° C. or lower from the viewpoints of high reactivity and pot life. The radical polymerization initiator may be used in combination with a decomposition promoter, an inhibitor, and the like. The polymerization initiator is used singly or in combination of two or more thereof.

Examples of thermosetting resins include an epoxy resin, a cyanate ester resin, a maleimide resin, an allylnadiimide resin, a phenol resin, a urea resin, a melamine resin, an alkyd resin, an acrylic resin, an unsaturated polyester resin, a diallyl phthalate resin, a silicone resin, a resorcinol formaldehyde resin, a xylene resin, a furan resin, a polyurethane resin, a ketone resin, a triallyl cyanurate resin, a polyisocyanate resin, a resin containing tris(2-hydroxyethyl) isocyanurate, a resin containing triallyl trimellitate, a thermosetting resin synthesized from cyclopentadiene, and a thermosetting resin obtained by trimerizing an aromatic dicyanamide. The thermosetting resin is used singly or in combination of two or more thereof. For example, the content of the thermosetting resin may be 20 mass % or more and may be 50 mass % or less based on the total amount of an adhesive component.

In a case where the adhesive component contains a thermosetting resin, the adhesive component may further contain a curing agent. The curing agent may be melamine and a derivative thereof, a hydrazide curing agent, boron trifluoride-amine complexes, a sulfonium salt, an amineimide, diaminomaleonitrile, a polyamine salt, dicyandiamide, and modified products thereof. The curing agent may be a polyaddition-type curing agent such as polyamines, polymercaptans, polyphenols, and acid anhydrides, or a polyaddition-type curing agent and a catalyst-type curing agent may be used in combination. The curing agent is used singly or in combination of two or more thereof. For example, the content of the curing agent may be 0.5 mass % or more and may be 15 mass % or less based on the total amount of an adhesive component.

The adhesive component may further contain a polymerization inhibitor. The polymerization inhibitor may be hydroquinone, methyl ether hydroquinone, or the like. For example, the content of the polymerization inhibitor may be 0.05 mass % or more and may be 5 mass % or less based on the total amount of an adhesive component.

The adhesive component may further contain a filler such as silica particles, a softener, a promoter, an antiaging agent, a colorant, a flame retardant, a thixotropic agent, a coupling agent, and the like.

In a case where an adhesive composition is formed in a film shape, the adhesive component may further contain a thermoplastic resin to enhance the film-forming property. Examples of thermoplastic resins include polystyrene, polyethylene, polyvinyl butyral, polyvinyl formal, polyimides, polyamides, polyesters, polyvinyl chloride, polyphenylene oxide, a urea resin, a melamine resin, a phenol resin, a xylene resin, an epoxy resin, a polyisocyanate resin, a phenoxy resin, a polyimide resin, a polyester urethane resin, and a polyurethane resin.

The thermoplastic resin is preferably an epoxy resin or a phenoxy resin, and may be an epoxy resin or a phenoxy resin which has a weight-average molecular weight of 10,000 or more as obtained through high-performance liquid chromatography (HPLC) from the viewpoint of further improving connection reliability. The adhesive component may contain resins obtained such that these resins are modified with a radically polymerizable functional group. The adhesive component may contain a styrene resin or an acrylic resin in addition to the resins with the purpose of adjusting melt viscosity or the like.

Figure 2:
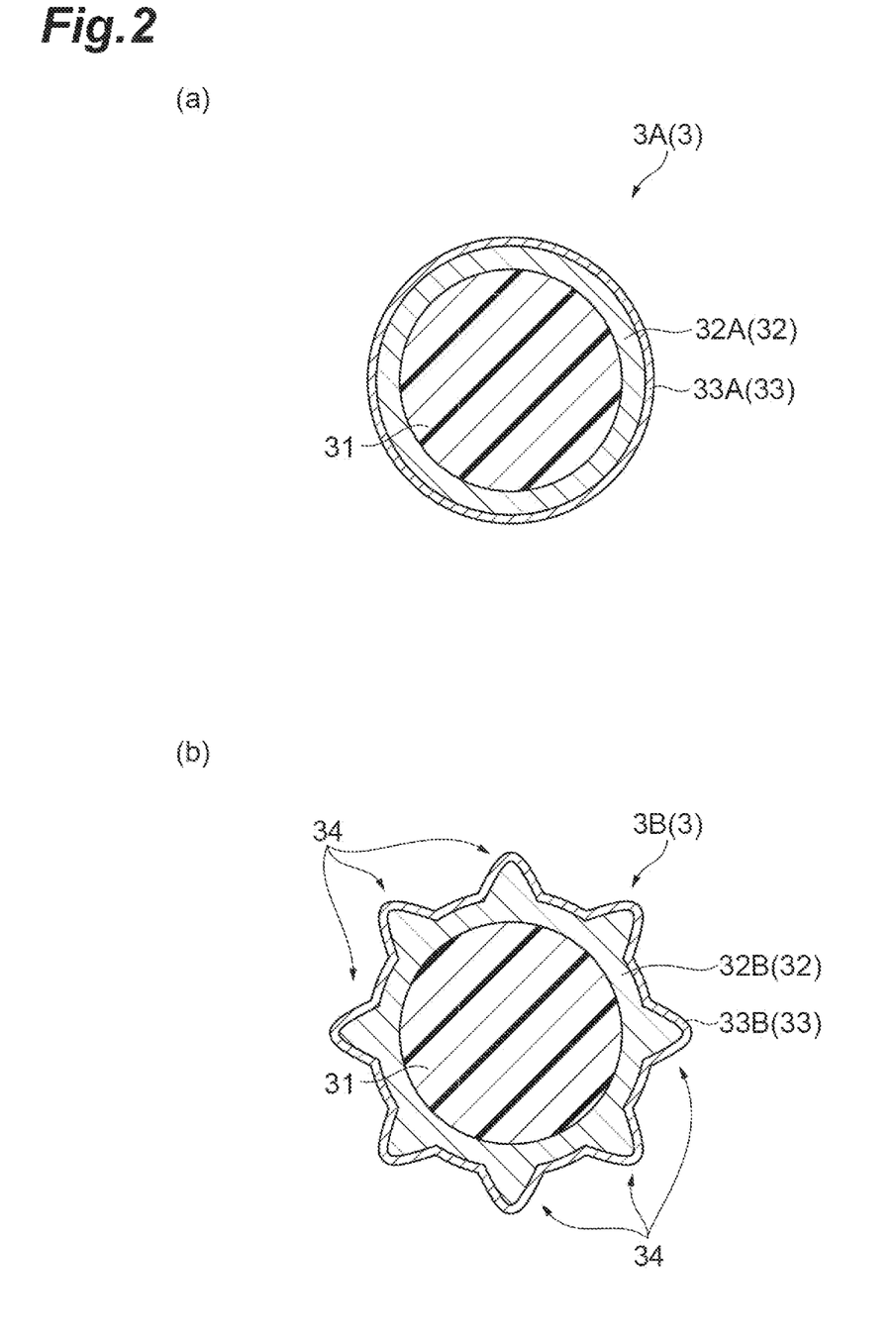
FIG. 2 shows cross-sectional views schematically illustrating one embodiment of a conductive particle.

FIG. 2 shows cross-sectional views schematically illustrating one embodiment of the conductive particles 3 contained in the adhesive film 1. As shown in view (a) of FIG. 2, a conductive particle 3A according to the embodiment includes a substantially spherical polymer particle 31, a first metal layer 32A provided on the polymer particle 31, and a second metal layer 33A provided on the first metal layer 32A. The conductive particle 3A may be substantially spherical. Substantially the entire surface of the polymer particle 31 is preferably covered with the first metal layer 32A and the second metal layer 33A. However, a part of the surface of the polymer particle 31 may be exposed without being covered with the first metal layer 32A and the second metal layer 33A within a range where the function of electrically connecting the circuit members to each other is maintained.

The polymer particle 31 may be a particle containing a polymer containing at least one monomer selected from styrene and divinylbenzene as a monomer unit, for example. The polymer may further contain a (meth)acrylate as a monomer unit.

The average particle diameter of polymer particles 31 may be preferably 1 μm or more and 40 μm or less. From the viewpoint of high-density mounting, the average particle diameter of the polymer particles 31 may be more preferably 1 μm or more and 30 μm or less. From the viewpoint of maintaining a more stable connection state in a case where there is variation in irregularity of the surface of an electrode, the average particle diameter of the polymer particles 31 may be still more preferably 2 μm or more and 20 μm or less.

The first metal layer 32A is made of, for example, Ni, Cu, NiB, Ag, or Ru, and preferably made of Ni. The thickness of the first metal layer 32A may be 50 nm or more and may be 300 μm or less, for example.

The second metal layer 33A may be made of Pd or Au, and is preferably made of Pd from the viewpoint of further improving connection reliability. That is, the conductive particle 3A has a layer made of Au or Pd as the outermost surface of the conductive particle 3A, and preferably has a layer made of Pd from the viewpoint of further improving reliability. The thickness of the second metal layer 33A may be 2 nm or more, 5 nm or more, or 10 nm or more, and may be 200 nm or less, 100 nm or less, or 50 nm or less.

The average particle diameter of conductive particles 3A may be preferably 1 μm or more and 100 μm or less. From the viewpoint of high-density mounting, the average particle diameter of the conductive particles 3A may be more preferably 50 μm or less. From the viewpoint of maintaining a more stable connection state in a case where there is variation in irregularity of the surface of an electrode, the average particle diameter of the conductive particles 3A may be still more preferably 2 μm or more or 3 μm or more and 30 μm or less or 20 μm or less.

In the present specification, the average particle diameter of the polymer particles and the average particle diameter of the conductive particles are defined as average values of particle diameters obtained by measuring the particle diameters of 300 polymer particles and 300 conductive particles in an adhesive composition through observation using a scanning electron microscope (SEM).

The thickness of the first metal layer 32A and the second metal layer 33A means a thickness of a portion of each metal layer in which no protruding portion to be described below is formed. The thickness of each of the first metal layer 32A and the second metal layer 33A is defined as an average value of thickness obtained by measuring the thickness of the first metal layer and the second metal layer of 300 conductive particles in an adhesive composition through observation using a scanning electron microscope (SEM).

In another embodiment, protruding portions may be formed on the surface of the conductive particles 3. As shown in view (b) of FIG. 2, a conductive particle 3B according to the other embodiment includes a substantially spherical polymer particle 31, a first metal layer 32B provided on the polymer particle 31, and a second metal layer 33B provided on the first metal layer 32B, and a plurality of protruding portions 34 are formed on the surface of the conductive particle 3B. Hereinafter, this conductive particle 3B will be described. However, since it is common to the conductive particle 3A shown in view (a) of FIG. 2 except that the conductive particle 3B has the protruding portions 34, the description of the common configuration will not be repeated.

In the conductive particle 3B, the protruding portions 34 are constituted of the first metal layer 32B and the second metal layer 33B. The height of the protruding portions 34 is, from the viewpoint of further improving connection reliability, preferably 60 nm or more, 90 nm or more, or 100 nm or more, and preferably 1,200 nm or less, 600 nm or less, 400 nm or less, or 200 nm or less.

Here, the height of the protruding portions 34 is determined by analyzing a two-dimensional image including projection images of the conductive particles. The analysis of the two-dimensional image can be performed according to the method disclosed in Japanese Unexamined Patent Publication No. 2016-61722.

Specifically, the height of the protruding portions can be determined, for example, through a method including: a step of detecting particle edges that are boundaries between projection images of a plurality of conductive particles and other regions in a two-dimensional image in which the conductive particles are imaged; a step of calculating center coordinates of the conductive particles on the two-dimensional image based on the particle edges; a step of dividing an particle edge into a plurality of particle edge portions (for example, 12 portions) for each predetermined angle around the center coordinates and calculating the difference between maximum values and minimum values of the distances between the center coordinates and the particle edges for each of the plurality of the particle edge portions to calculate an average value of the differences as the height of the protrusions; and a step of calculating an average value of the heights of the protrusions calculated for the plurality of conductive particles (for example, 5 to 100 arbitrary particles).

In the above-described analysis of the two-dimensional image, the particle edges correspond substantially to the outer circumference of the two-dimensional projection images of the conductive particles, the outer circumference including irregularities derived from the protruding portions. Frequency distribution of brightness obtained from the two-dimensional image generally shows a minimum value that reflects the particle edge portions. The two-dimensional image is binarized with the brightness corresponding to this minimum value as a first threshold value to produce a binarized image. Edges formed in the obtained binarized image are detected as particle edges. Center coordinates of the conductive particles on the two-dimensional image are calculated based on the particle edges. Circles that fit the particle edges are obtained through a least-squares method, and the centers of the circles are considered as center coordinates of the conductive particles.

The area ratio of the protruding portions 34 to all the projection images of the surfaces of the conductive particles 3 (the area proportion of the protruding portions 34) is, from the viewpoint of further improving connection reliability, preferably 8% or more, 9% or more, 10% or more, or 20% or more, and preferably 60% or less or 50% or less.

The area proportion of the protruding portions can also be determined by analyzing the two-dimensional image of the conductive particles according to the method disclosed in Japanese Unexamined Patent Publication No. 2016-61722. The area proportion of the protruding portions can be determined by a method including: a step of calculating second threshold values corresponding to boundaries between protruding portions and other portions from the frequency distribution of brightness in regions inside the particle edges; a step of binarizing the regions inside the particle edges using the obtained second threshold values to produce a binarized image; and a step of calculating the area ratio of the regions corresponding to the protruding portions to the area inside the particle edges in the obtained binarized image as an area proportion of the protruding portions.

The above-described conductive particles 3 can be obtained by, for example, forming a first metal layer 32 and a second metal layer 33 on the surface of the polymer particle 31 through metal plating. More specifically, the second metal layer 33 can be obtained by, for example, forming the first metal layer 32 on the surface of the polymer particle 31 through metal plating and then forming a layer of Au or Pd through substitution plating.

In a case where the conductive particle 3B shown in view (b) of FIG. 2 is produced, the protruding portions 34 can be formed by changing the thickness of the first metal layer 32 and the second metal layer 33 by changing the plating conditions during metal plating. More specifically, the protruding portions 34 can be formed by, for example, gradually increasing the concentration of a plating solution in the process of metal plating.

Since the above-described conductive particles 3 have the second metal layer 33 made of Pd or Au as the outermost surfaces of the conductive particles 3, more reliable electrical connection can be obtained in a case where circuit members (details will be described below) in which electrodes to be connected have a layer made of Cu or Ag as the outermost surfaces thereof are connected to each other using an adhesive composition (adhesive film 1) containing these conductive particles 3.

The content of the conductive particles 3 contained in the adhesive film 1 is determined according to fineness of the electrodes to be connected, and the like. The content of the conductive particles 3 may be, with respect to 100 parts by mass of an adhesive component, for example, 1 part by mass or more and 200 parts by mass or less, and may be, from the viewpoints of insulation properties and production costs, preferably 100 parts by mass or less and 50 parts by mass or less.

The adhesive composition may contain only the above-described conductive particles 3 as conductive particles, or may further contain conductive particles in addition to the above-described conductive particles 3 (hereinafter, also referred to as "other conductive particles").

The other conductive particles may be, for example, conductive particles with a dendrite shape (also called a branch shape). The dendritic conductive particles include one main shaft and a plurality of branches that branch from the main shaft two-dimensionally or three-dimensionally. The dendritic conductive particles may be made of metals such as copper and silver and may be, for example, silver-coated copper particles obtained by coating copper particles with silver.

Specifically, the dendritic conductive particles are available as, for example, ACBY-2 (Mitsui Mining & Smelting Co., Ltd.), CE-1110 (Fukuda Metal Foil & Powder Co., Ltd.), #FSP (IX Nippon Mining & Metals Corporation), and #51-R (JX Nippon Mining & Metals Corporation). Alternatively, the dendritic conductive particles can also be produced through a well-known method (for example, the method disclosed in PCT International Publication No. WO2014/021037).

The other conductive particles may be, in addition to the dendritic conductive particles, acicular conductive particles (for example, acicular conductive particles (available as YTA-1575 (YCC, Yokosawa Metal Co., Ltd.)) obtained by coating a potassium titanate fiber with silver) and amorphous conductive particles (for example, amorphous conductive particles (available as CC-13D (YCC, Yokosawa Metal Co., Ltd.)) obtained by coating graphite with copper), for example.

For example, the content of the other conductive particles may be 5 parts by mass or more and may be 100 parts by mass or less with respect to 100 parts by mass of an adhesive component.

The adhesive composition may be in the form of a multilayer film (multilayer adhesive film). The multilayer adhesive film may have, for example, a two-layer structure composed of a layer containing conductive particles and a layer containing no conductive particles or a three-layer structure composed of a layer containing conductive particles and layers which contain no conductive particles and are provided on both sides of the layer. The multilayer adhesive film may include a plurality of layers containing conductive particles. The multilayer adhesive film may include an adhesive layer exhibiting high adhesiveness to circuit members to be connected in consideration of the adhesiveness to the circuit members. In a case where these multilayer adhesive films are used, since conductive particles can be efficiently captured on connection electrodes, which is advantageous for connecting circuit members with a narrow pitch.

The adhesive composition (adhesive film) described above is suitably used as a material (circuit connection material) for connecting circuit members to each other, and more specifically, is particularly suitably used as an anisotropic conductive adhesive composition (anisotropic conductive adhesive film) or an isotropic conductive adhesive composition (isotropic conductive adhesive film) for connecting circuit members.

Figure 3:
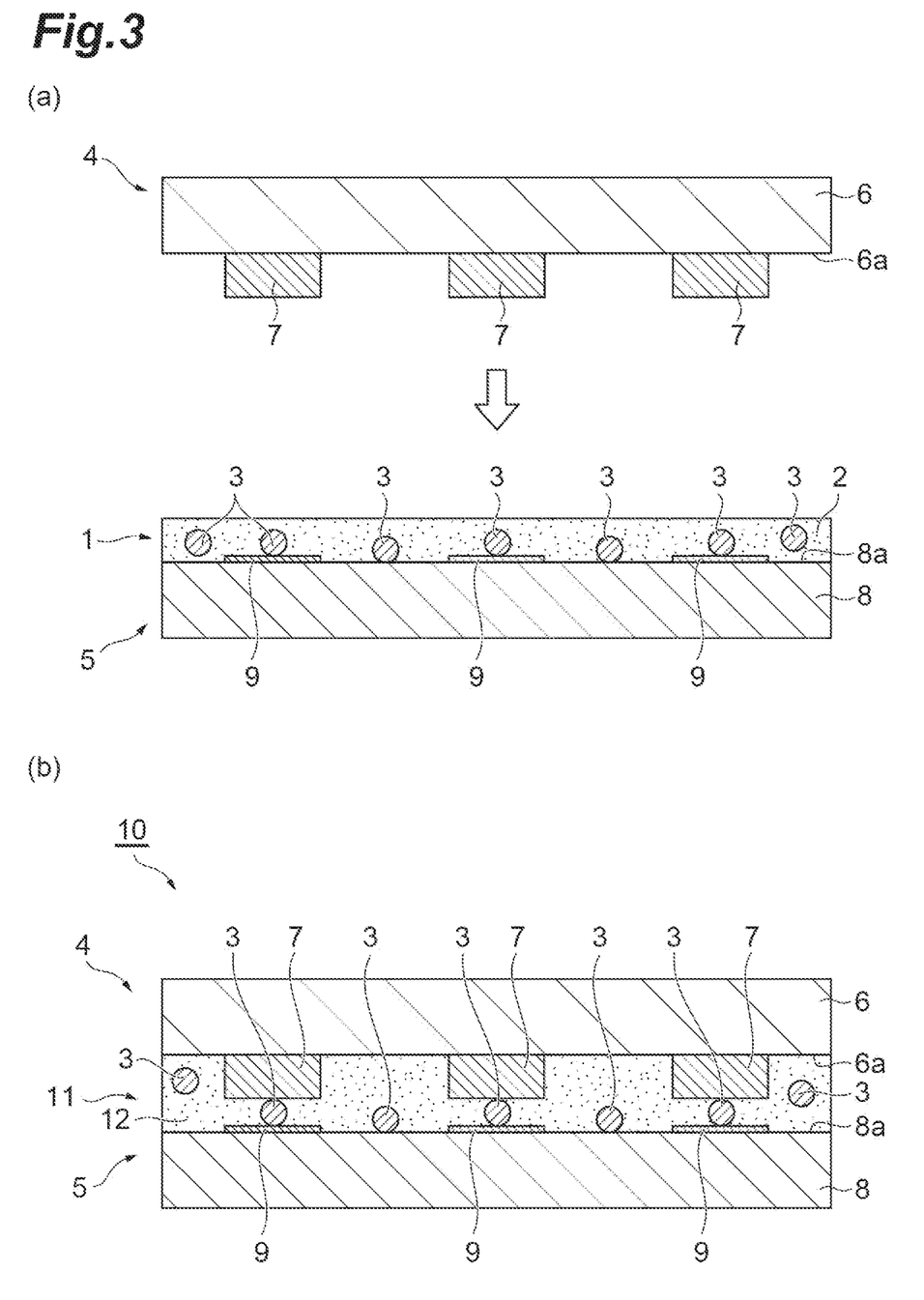
FIG. 3 shows cross-sectional views schematically illustrating one embodiment of a method for producing a connected structure.

Next, a method for producing a connected structure using the adhesive film 1 will be described. FIG. 3 shows cross-sectional views schematically illustrating a method for producing a connected structure according to one embodiment. First, a first circuit member 4, a second circuit member 5, and an adhesive film 1 (circuit connection material) are prepared as shown in view (a) of FIG. 3. The first circuit member 4 includes a first substrate 6 and a first electrode 7 provided on one surface 6a of the first substrate 6. The second circuit member 5 includes a second substrate 8 and a second electrode 9 provided on one surface 8a of the second substrate 8.

Next, the first circuit member 4 and the second circuit member 5 are arranged such that the first electrode 7 and the second electrode 9 face each other, and a stacked body is produced by arranging the adhesive film 1 between the first circuit member 4 and the second circuit member 5.

Then, the adhesive film 1 is cured while pressing the entire stacked body in a direction indicated by the arrow in view (a) of FIG. 3. The pressure during pressurization may be, for example, 1 to 10 MPa per total connection area. The method for curing adhesive film 1 may be performed through heating or through light irradiation in combination with heating. Heating may be performed, for example, at 100° C. to 170° C. Pressurization and heating (light irradiation as necessary) may be performed, for example, for 1 to 160 seconds. Accordingly, the first circuit member 4 and the second circuit member 5 are press-bonded via the cured product of the adhesive composition constituting the adhesive film 1.

In the above-described embodiment, the adhesive film 1 is arranged between the first circuit member 4 and the second circuit member 5. However, a paste-like adhesive composition may be applied onto one or both of the first circuit member 4 and the second circuit member 5 instead of the adhesive film.

As shown in view (b) of FIG. 3, a connected structure 10 according to one embodiment thus obtained includes: a first circuit member 4 having a first substrate 6 and a first electrode 7 provided on the first substrate 6; a second circuit member 5 having a second substrate 8 and a second electrode 9 provided on the second substrate 8; and a connecting portion 11 which is provided between the first circuit member 4 and the second circuit member 5 and electrically connects the first circuit member 4 (first electrode 7) and the second circuit member 5 (second electrode 9) to each other. The connecting portion 11 is composed of a cured product of an adhesive composition and includes a cured product 12 of an adhesive component 2 and conductive particles 3 dispersed in the cured product 12. In the connected structure 10, the first electrode 7 and the second electrode 9 are electrically connected to each other through interposition of the conductive particles 3 between the first electrode 7 and the second electrode 9.

The first substrate 6 may be, for example, an IC chip or a flexible substrate. The second substrate 8 may be a flexible substrate, a glass substrate, or a composite substrate having a glass substrate and an insulating film provided on the glass substrate.

As a combination of the first substrate 6 and the second substrate 8, more specifically, the first substrate 6 may be an IC chip or a flexible substrate, and the second substrate 8 may be a flexible substrate. Alternatively, the first substrate 6 may be an IC chip or a flexible substrate, and the second substrate 8 may be a glass substrate or a composite substrate. In other words, when the second substrate 8 is a flexible substrate, the first substrate 6 may be an IC chip or a flexible substrate. When the first substrate 6 is an IC chip and the second substrate 8 is a flexible substrate, the above-described adhesive film 1 is used for chip-on-plastic substrate (COP) connection. When the first substrate 6 and the second substrate 8 are flexible substrates, the above-described adhesive film 1 is used for film-on-plastic substrate (FOP) connection.

The flexible substrate contains, for example, at least one thermoplastic resin selected from the group consisting of polyimide (PI), polyethylene terephthalate (PET), polycarbonate (PC), and polyethylene naphthalate (PEN).

The flexible substrate may further have, for example, a protective film and/or a modified film such as a hard coat provided on the surface of an organic base material to improve optical and mechanical properties. In order to facilitate handling and transportation of the flexible substrate, a glass base material and a reinforcing material selected from SUS or the like may be pasted to an organic base material.

From the viewpoints of ensuring bendability and strength of the substrate alone as a film, the thickness of the flexible substrate may be 10 μm or more and may be 200 μm or less or 125 μm or less.

The glass substrate may be made of soda glass, quartz glass, or the like, or may be a substrate obtained by subjecting these kinds of glass to a chemical strengthening treatment from the viewpoint of preventing breakage due to external stress. The composite substrate may have a glass substrate and an insulating film which is provided on the surface of the glass substrate and composed of a polyimide or a colored inorganic or organic material for decoration, and electrodes may be formed on the insulating film in the composite substrate.

In a case where the second substrate 8 is a flexible substrate, the first substrate 6 may be a printed substrate or an electronic component such as an active element such as a semiconductor chip, a transistor, a diode, or a thyristor, or a passive element such as a capacitor, a resistor, or a coil. In a case where the first substrate 6 is an IC chip, projection electrodes (first electrodes 7) such as wire bumps obtained by melting a distal end of a gold wire or a bump formed through plating through a torch or the like to form gold balls, press-bonding these balls on an electrode pad, and then cutting the wire are provided. This can be used as the first circuit member 4.

The first electrode 7 and the second electrode 9 may be made of, for example, metals such as Ag, Ni, Al, Au, Cu, Sn, Ti, or Mo or metal oxides such as ITO or IZO. The first electrode 7 and the second electrode 9 may be made of the same material or different materials. The first circuit member 4 and the second circuit member 5 may be provided with one first electrode 7 or second electrode 9, but are preferably provided with many first electrodes 7 and second electrodes 9 at predetermined intervals.

At least one of first electrode 7 and the second electrode 9 has a layer made of Cu or Ag as an outermost surface of the electrode, and only one of the first electrode 7 and the second electrode 9 preferably has a layer made of Cu or Ag as an outermost surface of the electrode. In one embodiment, the first electrode 7 may have a layer made of Sn as an outermost surface of the electrode and the second electrode 9 may have a layer made of Cu as an outermost surface of the electrode, the first electrode 7 may have a layer made of Cu as an outermost surface of the electrode and the second electrode 9 may have a layer made of ITO as an outermost surface of the electrode, and the first electrode 7 may have a layer made of Sn or Au as an outermost surface of the electrode and the second electrode 9 may have a layer made of Ag as an outermost surface of the electrode.

When the above-described circuit connection material (adhesive film) is used, more reliable electrical connection can be obtained even in a case where at least one of the first electrode 7 and the second electrode 9 has a layer made of Cu or Ag as an outermost surface of the electrode.

EXAMPLES

Hereinafter, the present invention will be described more specifically with reference to the examples. However, the present invention is not limited to these examples.

Example 1

<Synthesis of polyurethane acrylate (UA1)>
2,500 parts by mass (2.50 mol) of poly(1,6-hexanediol carbonate) (trade name: Duranol T5652, manufactured by Asahi Kasei Chemicals Corporation, a number average molecular weight of 1,000) and 666 parts by mass (3.00 mol) of isophorone diisocyanate (manufactured by Sigma-Aldrich Co. LLC.) were uniformly added dropwise to a reaction container including a stirrer, a thermometer, a reflux condenser tube having a calcium chloride drying tube, and a nitrogen gas introduction tube over 3 hours. Next, nitrogen gas was sufficiently introduced into the reaction container, and then the inside of the reaction container was heated to 70° C. to 75° C. for reaction. Next, 0.53 parts by mass (4.3 mmol) of hydroquinone monomethyl ether (manufactured by Sigma-Aldrich Co. LLC.) and 5.53 parts by mass (8.8 mmol) of dibutyltin dilaurate (manufactured by Sigma-Aldrich Co. LLC.) were added to the reaction container, and then 238 parts by mass (2.05 mol) of 2-hydroxyethyl acrylate (manufactured by Sigma-Aldrich Co. LLC.) was added thereto to cause a reaction at 70° C. for 6 hours in an air atmosphere. Accordingly, polyurethane acrylate (UA1) was obtained. The weight average molecular weight (Mw) of the polyurethane acrylate (UA 1) was 15,000. The weight-average molecular weight was measured using a calibration curve with standard polystyrene through gel permeation chromatography (GPC) according to the following conditions.

(Measurement Conditions)

Device: GPC-8020 manufactured by Tosoh Corporation

Detector: RI-8020 manufactured by Tosoh Corporation

Column: Gelpack GLA160S+GLA150S manufactured by Hitachi Chemical Co., Ltd.

Sample concentration: 120 mg/3 mL

Solvent: Tetrahydrofuran

Injection amount: 60 μL

Pressure: $2.94 \times 10^6$ Pa (30 kgf/cm$^2$)

Flow rate: 1.00 mL/min

<Production of Conductive Particles 1>

A layer made of nickel (Ni) was formed on the surface of polystyrene particles having an average particle diameter of 5 μm so as to have a thickness of 100 nm, and a layer made of palladium (Pd) was further formed on the surface as a second metal layer so as to have a thickness of 20 nm. In this manner, conductive particles 1 having an average particle diameter of 5.2 μm and a specific gravity of 2.2 (g/cm$^3$) were obtained.

<Production of Film-Like Adhesive Composition (Adhesive Film)>

The following components were mixed with each other in the following formulation amounts (parts by mass), and then the above-described conductive particles 1 were mixed therewith so that the amount of conductive particles 1 became 5 parts by mass with respect to 100 parts by mass of the total solid contents (adhesive components) of the adhesive composition other than the conductive particles to obtain varnish of the adhesive composition. Subsequently, each of the varnish of the adhesive composition was applied onto the PET film with a thickness of 50 μm using a coating device. Subsequently, hot air drying was performed at 70° C. for 3 minutes to produce an adhesive film with a thickness of 14 μm on the PET film.

(Radically Polymerizable Compound)

Bis(acryloxyethyl) isocyanurate (product name: M-215, manufactured by Toagosei Co., Ltd.): 15 Parts by mass Polyurethane acrylate (UA1) synthesized as described above: 32.5 Parts by mass 2-Methacryloyloxyethyl acid phosphate (trade name: Light Ester P-2M manufactured by Kyoeisha Chemical Co., Ltd.): 1.5 Parts by mass (Radical Polymerization Initiator)

Benzoyl peroxide (trade name: Nyper BMT-K40 manufactured by NOF Corporation): 2.5 Parts by mass (Thermoplastic Resin)

Bisphenol A-type phenoxy resin (trade name: PKHC manufactured by Union Carbide Corporation): 42.5 Parts by mass (Coupling Agent)

3-Methacryloxypropyltrimethoxysilane (trade name: KBM503 manufactured by Shin-Etsu Chemical Co., Ltd.): 1 Part by mass (Filler)

Silica particles: (trade name: R104 manufactured by Nippon Aerosil Co., Ltd., an average particle diameter (primary particle diameter) of 12 nm): 5 Parts by mass (Solvent)

Methyl ethyl ketone: 150 parts by mass

Example 2

An adhesive film was produced in the same manner as in Example 1 except that conductive particles 2 produced as follows were used as conductive particles.

<Production of Conductive Particles 2>

The conductive particles 2 were produced similarly to the conductive particles 1 except that a layer made of gold (Au) was formed as a second metal layer instead of the layer made of Pd so as to have a thickness of 20 nm.

Example 3

An adhesive film was produced in the same manner as in Example 1 except that conductive particles 3 produced as follows were used as conductive particles.

<Production of Conductive Particles 3>

A layer made of Ni was formed on the surface of polystyrene particles having an average particle diameter of 3 μm so as to have a thickness of 100 nm, and a layer made of Pd was further formed on the surface as a second metal layer so as to have a thickness of 20 nm. In this manner, conductive particles 3 having an average particle diameter of 3.2 μm and a specific gravity of 2.5 (g/cm$^3$) were obtained.

Example 4

An adhesive film was produced in the same manner as in Example 1 except that conductive particles 4 produced as follows were used as conductive particles.

<Production of Conductive Particles 4>

The conductive particles 4 were produced similarly to the conductive particles 3 except that a layer made of Au was formed as a second metal layer instead of the layer made of Pd so as to have a thickness of 20 nm.

Comparative Example 1

An adhesive film was produced in the same manner as in Example 1 except that conductive particles 5 produced as follows were used as conductive particles.

<Production of Conductive Particles 5>

The conductive particles 5 were produced similarly to the conductive particles 1 except that the second metal layer was not provided.

Comparative Example 2

An adhesive film was produced in the same manner as in Example 1 except that conductive particles 6 produced as follows were used as conductive particles.

<Production of Conductive Particles 6>

The conductive particles 6 were produced similarly to the conductive particles 3 except that the second metal layer was not provided.

<Production of Connected Structure>

Connected structures 1 to 5 below were produced using the adhesive films of the examples and the comparative examples.

(Connected Structure 1 (Electrode Outermost Surfaces: Sn/Cu))

Each adhesive film (with PET film) of the examples and the comparative examples was cut into a size of 1 mm wide×4 cm long. In addition, a circuit member A1 (electrode outermost surface: Cu) obtained by providing electrodes in order of titanium (film thickness of 50 nm) and copper (film thickness of 500 nm) on a glass substrate was prepared. Subsequently, an adhesive film on a PET film was transferred onto the circuit member (so as to cover the electrodes). The transfer conditions were 70° C., 1 MPa, and 2 seconds. Thereafter, a flexible circuit member B1 (FPC, electrode outermost surface: Sn) having 150 tin-plated copper circuits with a pitch of 200 μm and a thickness of 8 μm on a polyimide substrate was temporarily fixed to the adhesive film exposed by peeling off the PET film, and a temporarily fixed structure was obtained. The temporary fixation conditions were 24° C., 0.5 MPa, and 1 second. Subsequently, the temporarily fixed structure was placed in a main crimping device, a silicone rubber sheet with a thickness of 200 μm was used as a cushion material, and the structure was heated and pressurized using a heating tool from FPC side under the conditions of 140° C. and 2 MPa for 10 seconds to connect the members to each other over a width of 1 mm. Accordingly, a connected structure was obtained.

(Connected Structure 2 (Electrode Outermost Surfaces: Cu/ITO))

A connected structure 2 was obtained similarly to the connected structure 1 except that a circuit member A2 (electrode outermost surface: ITO) obtained by providing ITO electrodes (film thickness of 100 nm) on a glass substrate was used instead of the circuit member A1 and that a flexible circuit member B2 (FPC, electrode outermost surface: Cu) having 150 copper circuits with a pitch of 200 μm and a thickness of 8 μm on a polyimide substrate was used instead of the flexible circuit member B1.

(Connected Structure 3 (Electrode Outermost Surfaces: Au/Cu))

A connected structure 3 was obtained similarly to the connected structure 1 except that a circuit member A3 (electrode outermost surface: Cu) obtained by providing Cu electrodes (film thickness of 500 nm) on a PET substrate was used instead of the circuit member A1 and that a flexible circuit member B3 (FPC, electrode outermost surface: Au) having 150 gold-plated copper circuits with a pitch of 200 μm and a thickness of 12 μm on a polyimide substrate was used instead of the flexible circuit member B1.

(Connected Structure 4 (Electrode Outermost Surfaces: Au/Ag))

A connected structure 4 was obtained similarly to the connected structure 1 except that a circuit member A4 (electrode outermost surface: Ag) obtained by providing electrodes (film thickness of 10 nm) formed of an Ag paste on a PET substrate was used instead of the circuit member A1 and that the flexible circuit member B3 (FPC, electrode outermost surface: Au) was used instead of the flexible circuit member B1.

(Connected Structure 5 (Electrode Outermost Surfaces: Sn/ITO))

A connected structure 5 was obtained similarly to the connected structure 1 except that the circuit member A2 (electrode outermost surface: ITO) was used instead of the circuit member A1.

<Evaluation of Connection Reliability>

The obtained connected structures were subjected to a reliability test at 85° C. and 85% RH for 500 hours. The connection resistance (Ω) between opposing circuit members was measured for the connected structures before and after the test. The results are shown in Table 1.

| | | Connection reliability (Ω) | | | | | | | | |
|---|---|---|---|---|---|---|---|---|---|---|
| | | Connected structure 1 (Sn/Cu) | | Connected structure 2 (Cu/ITO) | | Connected structure 3 (Au/Cu) | | Connected structure 4 (Au/Ag) | | Connected structure 5 (Sn/ITO) | |
| Adhesive film | Conductive particle No. (outermost surface) | Initial stage | After test | Initial stage | After test | Initial stage | After test | Initial stage | After test | Initial stage | After test |
| Example 1 | 1 (Pd) | 1 | 2 | 2 | 4 | 1 | 3 | 1 | 2 | 2 | 3 |
| Example 2 | 2 (Au) | 1 | 5 | 2 | 6 | 1 | 5 | 1 | 3 | 2 | 3 |
| Example 3 | 3 (Pd) | 1 | 2 | 2 | 3 | 1 | 4 | 1 | 2 | 2 | 3 |
| Example 4 | 4 (Au) | 1 | 3 | 2 | 5 | 1 | 5 | 1 | 3 | 2 | 3 |
| Comparative Example 1 | 5 (Ni) | 1 | 20 | 2 | 12 | 1 | 25 | 1 | 12 | 2 | 3 |
| Comparative Example 2 | 6 (Ni) | 1 | 14 | 2 | 13 | 1 | 32 | 1 | 10 | 2 | 3 |

In a case where the outermost surface of electrodes of at least one circuit member is made of Cu or Ag (connected structures 1 to 4), more reliable electrical connection was obtained using the adhesive films (Examples 1 to 4) containing the conductive particles 1 to 4 of which the outermost surface is made of Pd or Au compared to when the adhesive films (Comparative Examples 1 and 2) containing the conductive particles 5 and 6 of which the outermost surface is made of Ni were used. On the other hand, in a case where the outermost surface of electrodes of circuit members is made of metals other than Cu and Ag (connected structure 5), no difference in connection resistance depending on the type of outermost surface of the above-described conductive particles was observed.

REFERENCE SIGNS LIST

1: adhesive film, 2: adhesive component, 3: conductive particle, 4: first circuit member, 5: second circuit member, 6: first substrate, 7: first electrode, 8: second substrate, 9: second electrode, 10: connected structure, 11: connecting portion, 31: polymer particle, 32, 32A, 32B: first metal layer, 33, 33A, 33B: second metal layer, 34 protruding portion.

The invention claimed is:

1. A connected structure comprising:
a first circuit member comprising a first electrode;
a second circuit member comprising a second electrode; and
a connecting portion provided between the first circuit member and the second circuit member and electrically connecting the first electrode and the second electrode to each other,
wherein at least one of the first electrode and the second electrode comprises an outermost surface layer made of Cu,
wherein the connecting portion comprises a conductive particle comprising an outermost surface layer made of Pd or Au, and
wherein the outermost surface layer of the conductive particle has a thickness of 50 nm or less.

2. The connected structure according to claim 1, wherein the outermost surface layer of the conductive particle is made of Pd.

3. The connected structure according to claim 1, wherein the outermost surface layer of the conductive particle is made of Au.

4. The connected structure according to claim 1, wherein the conductive particle additionally comprises:
a polymer particle as a core; and
an additional layer provided on the polymer particle,
wherein the outermost surface layer of the conductive particle is provided on the additional layer, and
wherein the additional layer has a thickness of 300 nm or less.

5. An adhesive composition comprising:
an adhesive component; and
a conductive particle,
wherein the adhesive composition is used for bonding a first circuit member comprising a first electrode and a second circuit member comprising a second electrode to each other and electrically connecting the first electrode and the second electrode to each other,
wherein the conductive particle comprises an outermost surface layer made of Pd or Au,
wherein at least one of the first electrode and the second electrode comprises an outermost surface layer made of Cu, and
wherein the outermost surface layer of the conductive particle has a thickness of 50 nm or less.

6. The adhesive composition according to claim 5, wherein the outermost surface layer of the conductive particle is made of Pd.

7. The adhesive composition according to claim 5, wherein the adhesive component comprises a thermoplastic resin.

* * * * *